United States Patent [19]

Kawakami

[11] Patent Number: 6,002,296
[45] Date of Patent: Dec. 14, 1999

[54] FILTER CIRCUIT WITH AN INTERMITTENT CONSTANT CURRENT WITH CONSTANT PERIOD

[75] Inventor: Kenichi Kawakami, Kanagawa, Japan

[73] Assignee: NEC Corporation, Tokyo, Japan

[21] Appl. No.: 08/928,771

[22] Filed: Sep. 12, 1997

[30] Foreign Application Priority Data

Sep. 12, 1996 [JP] Japan ................................. 8-242304

[51] Int. Cl.⁶ .................................................. H03B 1/00
[52] U.S. Cl. ........................... 327/553; 327/552; 327/65; 327/563
[58] Field of Search ..................... 327/551, 552, 327/553, 557, 558, 559, 560, 561, 562, 563, 65, 67, 77, 52, 53, 66, 89

[56] References Cited

U.S. PATENT DOCUMENTS

| | | | |
|---|---|---|---|
| 5,266,852 | 11/1993 | Shinegari et al. | 307/250 |
| 5,396,188 | 3/1995 | Aoki | 327/552 |
| 5,461,336 | 10/1995 | Yada | 327/553 |
| 5,698,998 | 12/1997 | Bodenstab | 327/55 |
| 5,796,545 | 8/1998 | Canclini | 360/78.04 |

FOREIGN PATENT DOCUMENTS

| | | |
|---|---|---|
| 56-164615 | 12/1981 | Japan . |
| 2-302115 | 12/1990 | Japan . |
| 6-252695 | 9/1994 | Japan . |
| 7-297677 | 11/1995 | Japan . |

*Primary Examiner*—Kenneth B. Wells
*Assistant Examiner*—Hai L. Nguyen
*Attorney, Agent, or Firm*—Foley & Lardner

[57] ABSTRACT

A periodic low current from an intermittent Low current generator 5 is used, and fluctuations of r1 and r10, c1 and c2, and I6 and I20, thus cancel one another. Thus, $\omega_0$ is not fluctuated unless the oscillation frequency Tosc of a pulse wave generator OSC is fluctuated. Television and ratio audio ICs using an LPF filter do not require specific provision of any oscillator for a filter circuit, because they have an accurate oscillator. The oscillation frequency of the pulse wave generator OSC should be at least 20 times the pass band of the filter circuit.

10 Claims, 5 Drawing Sheets

FILTER CIRCUIT WITH AN INTERMITTENT CONSTANT CURRENT WITH CONSTANT PERIOD

BACKGROUND OF THE INVENTION

The present invention relates to a filter circuit for use in the audio frequency band.

Figure 5:
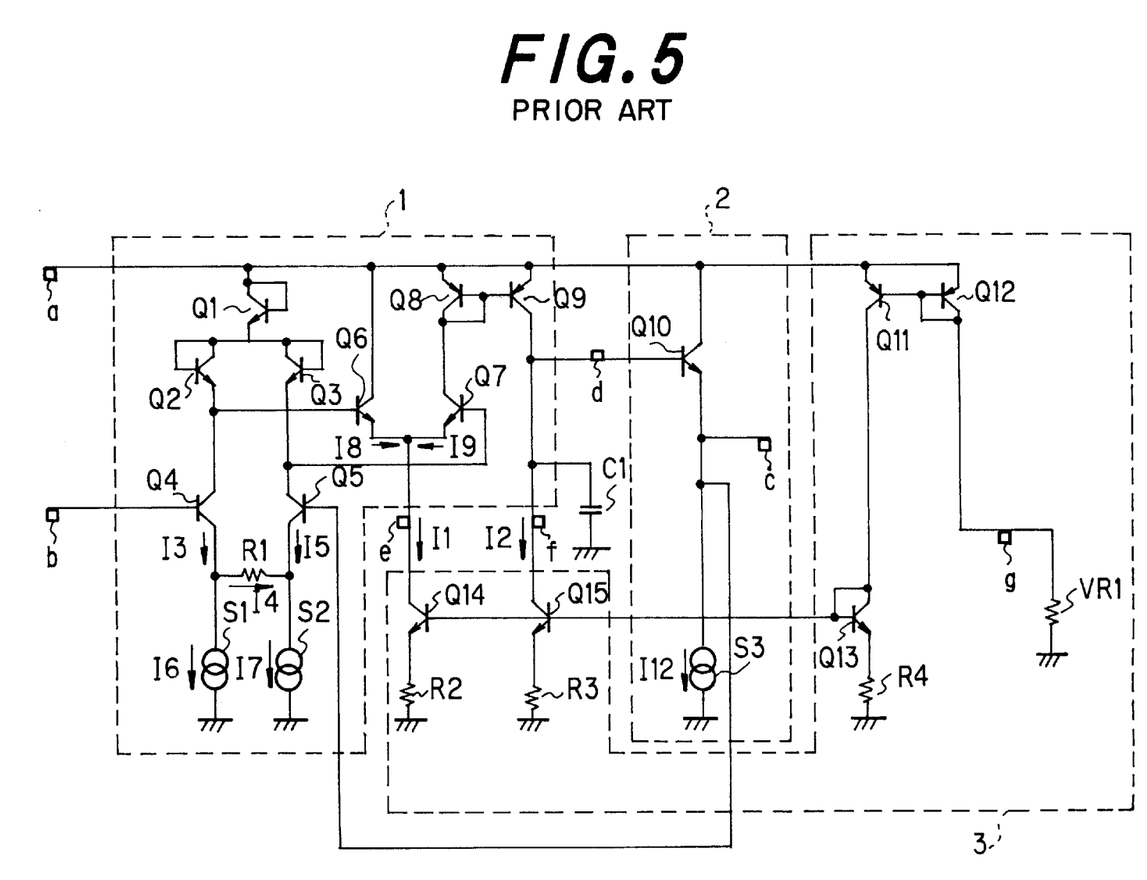
FIG. 5 shows a prior art pertaining filter circuit.

A prior art pertaining filter circuit will now be described with reference to FIG. 5. The illustrated filter circuit is a primary LPF (low-pass filter) having a gm (mutual conductance)-C (capacitance) type filter circuit construction. Referring to the figure, a differential amplifier 1 is furnished with a supply voltage Vcc at its terminal a, and amplifies a voltage difference between an input signal IN provided to its terminal b and an output signal OUT outputted from an output terminal c of a buffer circuit 2. The buffer circuit 2 converts the output impedance at an output terminal d of the differential amplifier 1. A variable constant current circuit 3 sets constant currents I1 and I2 at terminals e and f of the differential amplifier 1. The filter circuit further comprises a capacitor C1.

The differential amplifier 1 has the following construction. A transistor Q1 which is an NPN transistor, is used as an active load. Transistors Q2 and Q3 which are also NPN transistors, are used as active loads of transistors Q4 and Q5, respectively. The transistor Q4 is an NPN transistor with its base connected to the terminal b. When its base current which is generated by the voltage of the input signal IN exceeds a threshold current, the transistor Q4 is turned on to cause its collector current corresponding to the base current.

A constant current source S1 provides a current I6, which is the difference between the emitter current I3 through the transistor Q4 and a current I4 through a resistor R1 when I3>I5. When I3<I5, the current I6 is the sum of the currents I3 and I4. A resistor R1 is connected between the emitters of the transistors Q4 and Q5 for gain control of the differential amplifier 1.

The transistor Q5 is an NPN transistor with its base connected to the output terminal c. When its base current generated by the voltage of the output signal OUT exceeds its threshold current, the transistor Q5 is turned on to cause its collector current corresponding to the base current. A constant current source S2 provides a current I7, which is the sum of the emitter current I5 through the transistor Q5 and the current I4 through the resistor R1 when I3>I5. When I3<I5, the current I7 is the difference between the currents I3 and I4.

A transistor Q6 which is an NPN transistor, provides its collector current corresponding to its base current generated by the voltage between the base of the transistor Q2 and the collector of the transistor Q4, when the base current exceeds a threshold current.

A transistor Q7 which is also an NPN transistor, provides its collector current corresponding to its base current generated by the voltage between the base of the transistor Q3 and the collector of the transistor Q5 when the base current exceeds a threshold current.

A transistor Q8 which is a PNP transistor, forms a current mirror circuit with a transistor Q9, and serves as an active load of the transistor Q7. The transistor Q9 is also a PNP transistor, and causes a base current exceeding a threshold current with the same base voltage as the transistor Q8. A change in the base current causes a change in its collector current with the same ratio as the transistor Q8.

The buffer circuit 2 has the following construction. A transistor Q10 which is an NPN transistor with its base connected to the output terminal d of the differential amplifier 1, is turned on to cause its collector current corresponding to its base current generated by the voltage of the output signal at the output terminal when the base current exceeds a threshold current. A constant current source S3 provides a current I12, which is the difference between the emitter current I11 through the transistor Q10 and the output current. An output terminal c is connected to the base of the transistor Q5 of the differential amplifier 1.

The variable constant current source 3 has the following construction. A transistor Q11, which is a PNP transistor, forms a current mirror circuit with a transistor Q12. The transistor Q12 is also a PNP transistor, sets a desired current of a constant current circuit, which has transistors Q13 to Q15, by adjusting the resistance of a variable resistor VR1 while confirming the current at a measurement terminal g. The transistors Q13 to Q15 are NPN transistors.

The collector currents through the transistors Q14 and Q15 are the currents I1 and I2 at the terminals e and f of the differential amplifier 1, respectively. Resistors R1 to R3 serve as loads. The above circuit elements except for the variable resistor VR1 are provided in an IC (integrated circuit).

The operation of the above circuit will now be described with reference again to FIG. 5. When the voltage level of the input signal IN at the terminal b exceeds the voltage level of the output signal OUT, the emitter current I3 through the transistor Q4 which has been carrying sufficient base current, becomes higher than the emitter current I5 through the transistor Q5. As a result, the current I4 which is the difference of the current I6 through the constant current source S1 from the emitter current I3 through the transistor Q4, is caused through the constant current source S2.

The emitter voltage on the transistor Q5 thus becomes equal to the emitter voltage on the transistor Q4 to reduce the difference between the base and emitter voltages, thus reducing the current I5. The reduction of the current I5 causes the current I3 to be further increased to reduce the collector voltage on the transistor Q4 and increase the collector voltage on the transistor Q5. Consequently, the difference between the collector voltage on the transistor Q4 and the output voltage OUT is amplified. Since the collector of the transistor Q4 is connected to the base of the transistor Q6, the collector current through the transistor Q6 at this time is reduced to reduce the current I8.

Also, since the collector of the transistor Q5 is connected to the base of the transistor Q7, the collector current therethrough is increased. The base voltage on the transistor Q8 is thus decreased to increase the collector current therethrough and further increase the emitter current I9 through the transistor Q7, thus causing further amplification of the difference between the voltage of the input signal IN and the output signal OUT. The sum of the currents I8 and I9 is the constant current I1.

When the collector current which is flowing at this time through the transistor Q9 constituting the current mirror circuit with the transistor Q8 is increased and exceeds the constant current I2, for instance, the collector current becomes the base current through the transistor Q10. When this base current exceeds a threshold current, the transistor Q10 is turned on, thus causing amplification of its base current to increase its emitter voltage. This voltage constitutes the voltage of the output signal OUT. In the above way, the differential amplifier 1 performs the voltage amplification.

Figure 4:
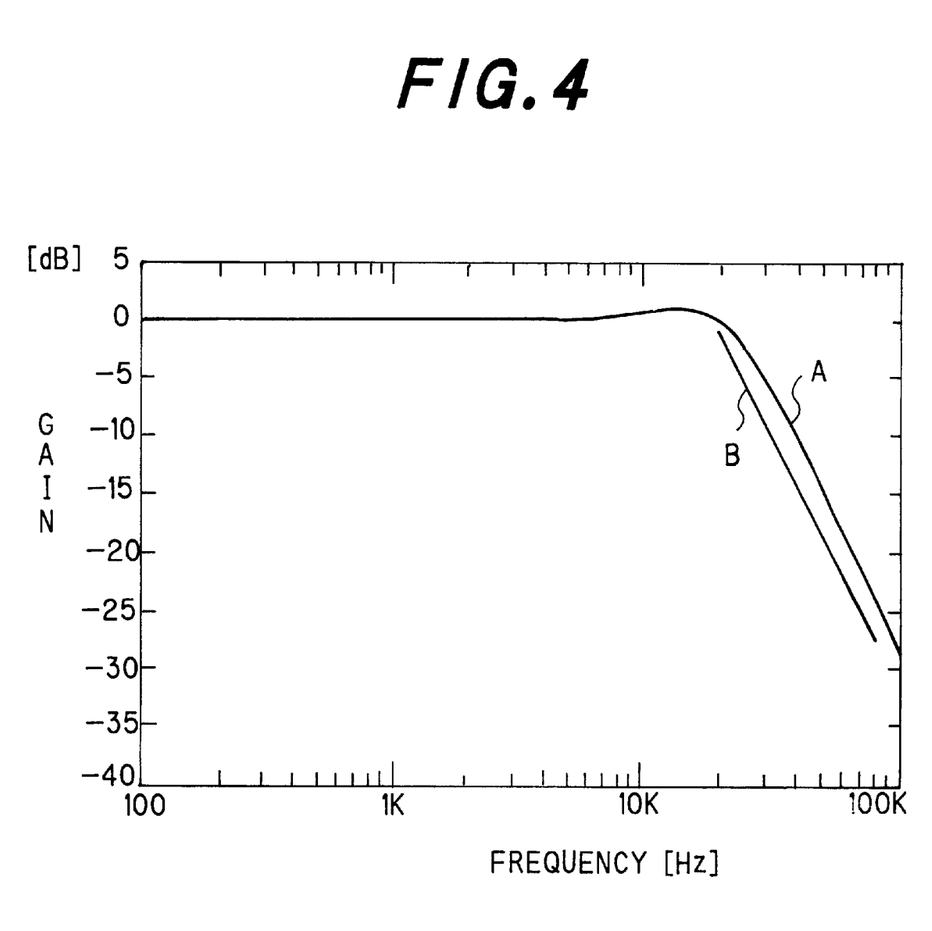
FIG. 4 is a graph showing the gain-frequency characteristic of the second embodiment and that of the prior art circuit.

Referring to FIG. 4, in the above filter circuit using the differential amplifier 1, a gm-C type LPF circuit is constituted by the differential amplifier 1 with mutual conductance gm and the capacitor C1. Denoting the voltage of the output signal OUT of the differential amplifier 1 by Vout, the voltage of the input signal IN by Vin, the resistance of the resistor R1 by r1, and the capacitance of the capacitor C1 by c1, the transfer function of the above circuit is:

$$Vout/Vin=(gm/c1)/(s+(gm/c1)) \quad (1)$$

This equation expresses a primary LPF equation, and the cut-off frequency 0 of the filter circuit is:

$$\omega_0=gm/c1 \quad (2)$$

Assuming I6=I7, the mutual conductance gm of the differential amplifier 1 can be expressed as:

$$gm=I1/2 \cdot r1 \cdot I6 \quad (3)$$

where I1 is usually set as I1=2·I2. BY substituting equation (2) into equation (3), $$\omega_0=I1/2 \cdot r1 \cdot I6 \cdot c1 \quad (4)$$

The fluctuations of the cut-off frequency $\omega_0$ due to fluctuations in manufacture also during operation, will now be described. Where the transistor Q14 is fabricated in an IC, for instance, the current I1 and the current through the transistor Q14 fluctuate with similar trends, so that the fluctuations of the cut-off frequency $\omega_0$ are cancelled. As for the fluctuations due to other circuit element fluctuations, denoting the resistance of the resistor R1 by [r1] and the capacitance of the capacitor C1 by [c1], the cut-off frequency $\omega_0$ is given as:

$$[\omega_0]=1/[r1] \cdot [c1] \quad (5)$$

Since the resistor R1 and the capacitor C1 are formed in an IC, [r1] and [c1] fluctuate without similar trends, i.e., without any bearing on each other.

This means that where all the filter circuit elements are formed in an IC, the cut-off frequency $\omega_0$ fluctuates extremely. For instance, assuming that the resistance fluctuations are within ±20% and that the capacitance fluctuations are within ±25%, the cut-off frequency fluctuation range is −33% to +67%. Such a fluctuation range is not permissible in a filter circuit, which accuracy is required for. Usually, therefore, an adjustable resistor R42 is provided outside the IC, and the cut-off frequency is adjusted to ensure accuracy with each IC manufactured.

The filter circuit described above has the problem that the cut-off frequency fluctuates extremely as described in Japanese Laid-Open Patent Publication No. 56-164615. To make up for such fluctuations and make the filter circuit to be an accurate one, a large number of external circuit elements as well as their adjustment are necessary as described in Japanese Patent Application No. 05-039030.

SUMMARY OF THE INVENTION

An object of the present invention is therefore to provide a filter circuit, which is free from cut-off frequency fluctuations and requires neither any external circuit element nor the adjustment thereof.

According to an aspect of the present invention, there is provided a filter circuit comprising, a variable constant current circuit for adjusting a constant current, a differential amplifier with the mutual conductance thereof varying according to the constant current, a buffer circuit for amplifying the output current of the differential amplifier, a first capacitor inserted between the output terminal of the differential amplifier and the input terminal of the buffer circuit, a reference wave generator for generating a reference wave with a constant period, and an intermittent constant current generator for supplying current to the variable constant current circuit with the constant period of the reference wave.

According to another aspect of the present invention, there is provided a filter circuit including a capacitance provided between an output of a differential amplifier with the mutual conductance thereof varying on the basis of a current value supplied thereto and an input of a buffer circuit for amplifying the output current of the differential amplifier, wherein the current value is determined by an intermimittent current with a constant period.

Other objects and features will be clarified from the following description with reference to attached drawings.

PREFERRED EMBODIMENTS OF THE INVENTION

Figure 1:
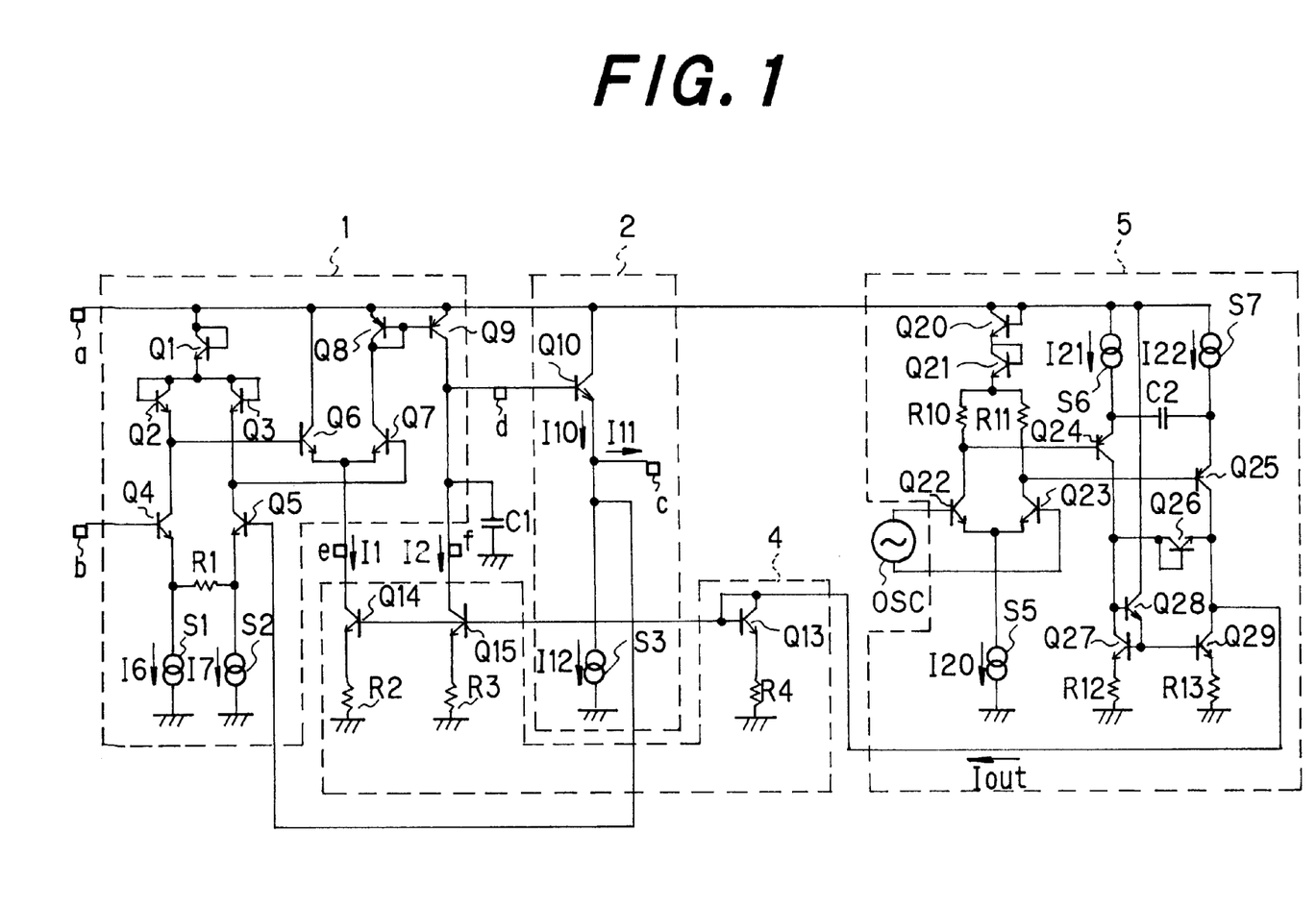
FIG. 1 is a block diagram showing a first embodiment of the filter circuit according to the present invention.

Embodiments of the present invention will now be described with reference to the drawings. FIG. 1 is a block diagram showing a first embodiment of the filter circuit according to the present invention. Referring to the figure, a differential amplifier 1 and a buffer circuit 2 are the same as those in the prior art filter circuit shown in FIG. 5. In a constant current circuit 4, transistors Q13 to Q15 and resistors R2 to R4 are the same as those in the variable constant current circuit 3 shown in FIG. 5. Reference numeral 5 designates an intermittent constant current generator, which generates a constant current periodically and sets a constant current through each transistor in the constant current circuit 4. Transistors Q20 and Q21 which are NPN transistors, form active loads. Transistors Q22 and Q23 have resistors R10 and R11 as their loads, respectively.

The transistors Q22 and Q23 are NPN transistors. A pulse wave generator OSC generates a pulse wave having a frequency sufficiently high compared to the cut-off frequency of the filter circuit, and alternately on-off operates the transistors Q22 and Q23. A constant current source S5 limits the sum of the emitter currents through the transistors Q22 and Q23 to a constant current I20. Transistors Q24 and Q25 are furnished with their collector currents from constant current sources S6 and S7, respectively.

The transistors Q24 and Q25 have their emitters furnished with constant currents I21 and I22 from the constant current sources S6 and S7, respectively. The transistors Q24 and Q25 are PNP transistors. A capacitor C2 is connected between the emitters of the transistors Q24 and Q25, and is charged by the constant currents I21 and I22.

A transistor Q26 which is an NPN transistor, is connected between the collectors of the transistors Q24 and Q25, and acts as a diode. Transistors Q27 to Q29 which are non transistors, form a constant current circuit. Resistors R12 and R13 are emitter resistors of the transistors Q27 and Q29, respectively. A transistor Q29 has its collector connected to the collector of the transistor Q13 and determines a constant current through each transistor in the constant current circuit 4.

Figure 2:
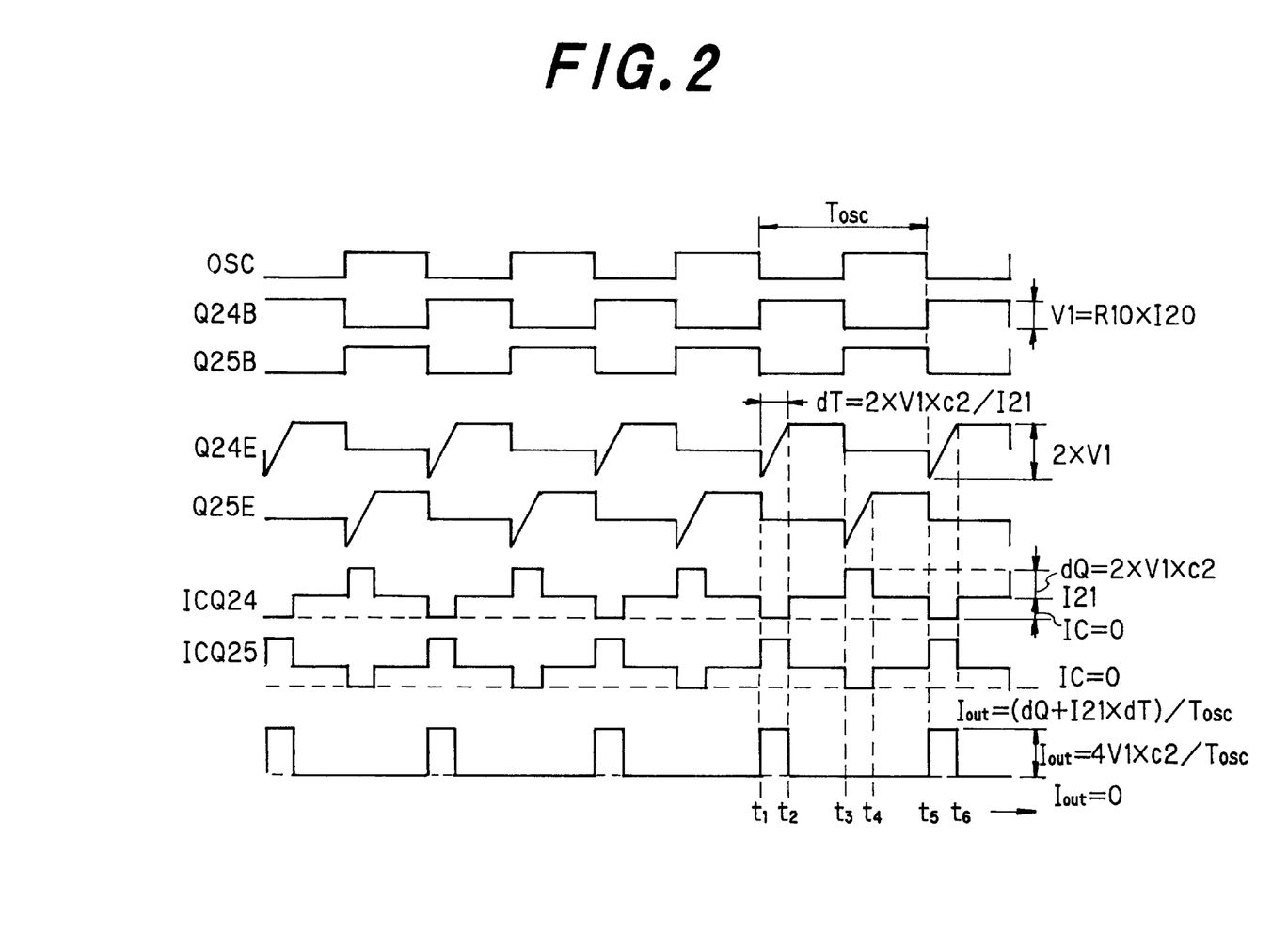
FIG. 2 is a timing chart showing waveforms generated in the operation of the first embodiment.

FIG. 2 is a timing chart showing waveforms generated in the operation of the first embodiment. Referring to the figure, labeled OSC is the waveform of the output of the pulse wave generator OSC. Labeled Q24B and Q25B are the base voltages on the transistors Q24 and Q25, respectively. Labeled Q24E and Q25E are the emitter voltages on the transistors Q24 and Q25, respectively. Labeled ICQ24 and ICQ25 are the collector currents through the transistors Q24 and Q25, respectively.

The operation of the first embodiment will now be described with reference to FIGS. 1 and 2. Since this embodiment is the same as the prior art example shown in FIG. 5 except for the intermittent constant current generator 5, the operation is described in detail in connection with the intermittent constant current circuit 5. The pulse period of the pulse wave generator OSC is set to Tosc. When the amplitude of the pulse wave generator OSC is sufficient for the switching of the differential amplifier which is constituted by the transistors Q22 and Q23, the amplitude level V1 of the base voltage Q24B on the transistor Q24 is:

$$V1 = r10 \cdot I20 \quad (6)$$

where r10 is the resistance of the resistor R10, and I20 is the current of the constant current source S5.

When the voltage Q24B rises at an instant t1 (and t5, etc.), the transistor Q24 is turned off, and the transistor Q25 is turned on. The capacitor C2 is thus immediately discharged momentarily, and turns to be charged by the current I22, causing the voltage Q24E to be increased linearly until the end of the charging of the capacitor C2 at an instant t2 (and t6, etc.). This action takes place alternately at the opposite terminals of the capacitor C2. The voltage Q25E is thus increased linearly from an instant t3 to an instant t4, increasing the amplitude level of the voltages Q24E and Q25E up to $2 \cdot V1$.

The period dT of charging of the capacitor C2 by the constant current is $$dT = 2 \cdot V1 \cdot c2 / I21 \quad (7)$$

where c2 is the capacitance of the capacitor C2.

During this period dT, the collector current through the transistor Q25 is the sum of the current I22 and the discharging current through the capacitor C2. Assuming that I21=I22, the charge dQ, which is discharged by the capacitor C2, is:

$$dQ = 2 \cdot v1 \cdot C2 \quad (8)$$

The current Iout at a terminal h of the intermittent constant current generator 5 is thus $$Iout = (dQ + I21 + dT)/Tosc \quad (9)$$

By substituting equation (8) into equation (9), $$Iout = 4 \cdot r10 \cdot I20 \cdot c2 / Tsoc \quad (10)$$

Assuming that I1=IOUT in the constant current circuit 4, by substituting equation (10) into equation (4), $$\omega_0 = 2 \cdot (r10/r1) \cdot (c2/c1) \cdot I20/I6) \cdot (1/Tsoc) \quad (11)$$

As is seen from equation (11), fluctuations of r1 and r10, c1 and c2, and I6 and I20, cancel one another, and thus $\omega_0$ is not fluctuated unless Tosc is fluctuated. A television or radio audio IC using an LPF requires assembling of no exclusive filtering oscillator because it has an accurate oscillator. The oscillation frequency of the pulse wave generator OSC should be at least 20 times the pass band of the filter circuit.

The first embodiment described above according to the present invention is by no means limitative, and changes and modifications in the details of the design and construction may be made without departing from the scope of the present invention.

Figure 3:
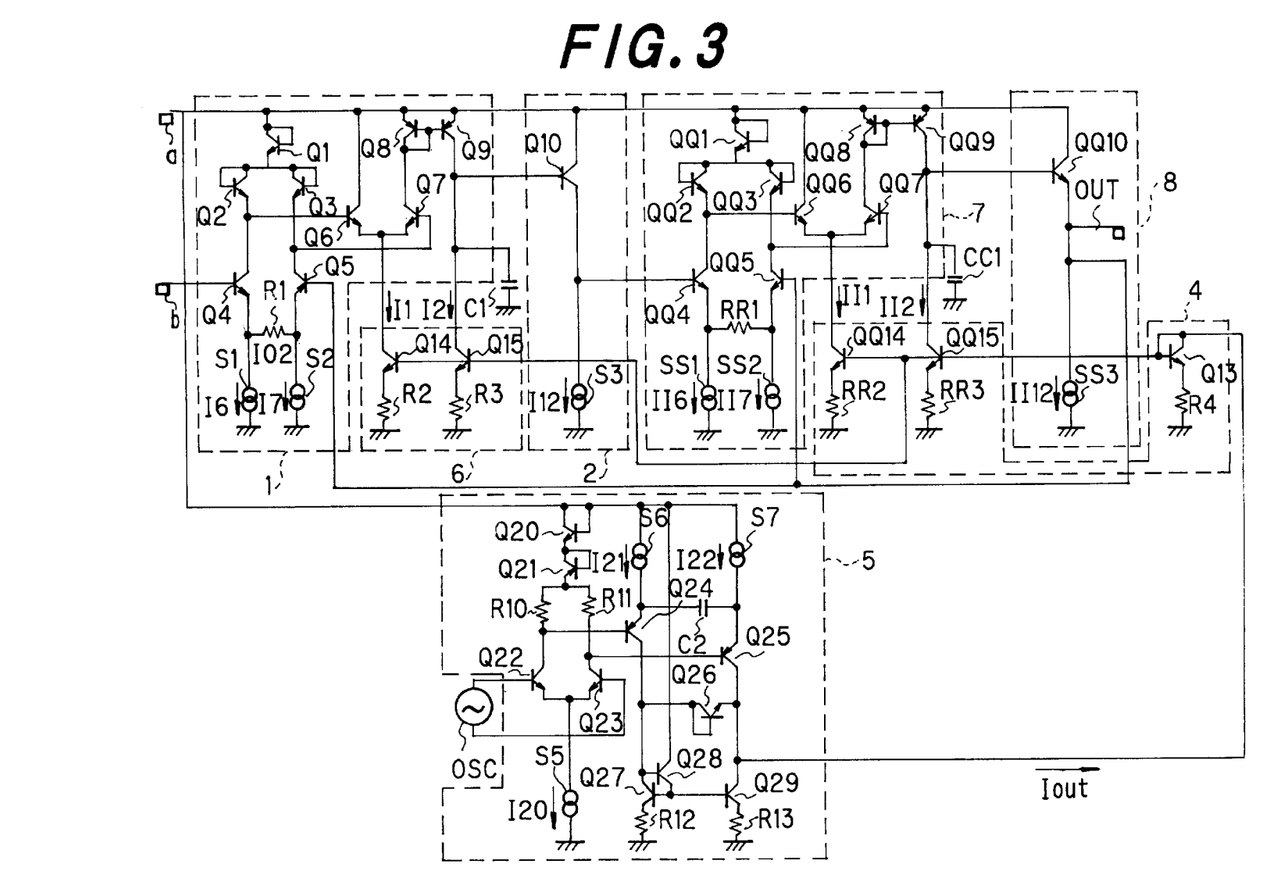
FIG. 3 is a block diagram showing a second embodiment of the present invention.

FIG. 3 shows a second embodiment of the present invention, in which a secondary LPF is constructed by serially connecting two LPFs having the same construction as the LPF in the first embodiment.

Referring to the figure, a differential amplifier 7 is the same in construction as the differential amplifier 1. Transistors QQ1 to QQ4 which are NPN transistors, have the same functions as the transistors Q1 to Q4. A resistor RR1 has the same function as the resistor R1. Transistors QQ6 and QQ7 which are NPN transistors, have the same functions as the transistors Q6 and Q7. Transistors QQ8 and QQ9 which are PNP transistors, have the same functions Q8 and Q9. Constant current sources SS1 and SS2 provide constant currents II6 and II7, respectively.

A buffer circuit 8 is the same in construction as the buffer circuity 2. A transistor QQ10 which is an NPN transistor, has the same function as the transistor Q10. A constant current source SS3 provides a constant current II22. A constant current circuit 6 has resistors RR2 and RR3 and transistors QQ14 and QQ15, these circuit elements having the same functions as those designated by like reference symbols in the constant current circuit 4. The component elements and operations of the individual component circuits are the same as in the first embodiment, and are not described.

Denoting the mutual conductances of the differential amplifiers 1 and 7 by gm and gm1, respectively, the capacitance of the capacitor CC2 corresponding to the capacitor C2 by cc2, the constant current of the constant current source SS2 corresponding to the constant current source S1 by II6, the voltage of the input signal IN at the terminal a by Vin, and the voltage of the output signal at a terminal OUT by Vout, the transfer function of the secondary LPS is given as $$Vout/Vin = (gm \cdot gm1/c1 \cdot cc1)/(s^2 + (gm1/cc1)s + (gm \cdot gm1/c1 \cdot cc1) \quad (12)$$

In this case, the cut-off frequency 0 is $$\omega_0 = \sqrt{(gm \cdot gm1 / c1 \cdot cc1)} \quad (13)$$

and Q which represents the sharpness of the frequency characteristic of the LPF is given as:

$$Q = \sqrt{(gm \cdot cc1 / gm1 \cdot c1)} \quad (14)$$

The cut-off frequency $\omega_0$ is also given as:

$$\omega_0 = 2 \cdot (r10 \cdot I20 \cdot c2 / Tosc) \cdot (1 / \sqrt{r1 \cdot rr1 \cdot c1 \cdot cc1 \cdot I6 \cdot II6} \quad (15)$$

where gm1 is:

$$gm1 = II1/2 \cdot rr1 \cdot II16 \quad (16)$$

Since I1=Iout, equation (10) is used. As is seen from equation (15), fluctuations of the resistances and capacitances cancel one another.

FIG. 4 is a graph showing the gain-frequency characteristic of the second embodiment and that of the prior art circuit, obtained by numerical simulation carried out by substituting actual constants and setting the frequency $f_0$ ($\omega_0/2\pi$) to 20 kHz, Q to 1, and the oscillation frequency of the pulse wave generator OSC to 1 MHz. Shown at A is the characteristic of the prior art circuit, and at B the characteristic of the second embodiment. As is seen from the graph, substantially the same result is obtainable, indicating that the use of the intermittent constant current generator 5 based on the pulse wave generator OSC does not result in filter circuit frequency characteristic deterioration.

A filter circuit according to the present invention, as claimed in claim 1, comprises a variable constant current circuit for adjusting a constant current, a differential amplifier with the mutual conductance thereof varying according to the constant current, a buffer circuit for amplifying the output current of the differential amplifier, a first capacitor inserted between the output terminal of the differential amplifier and the input terminal of the buffer circuit, a reference wave generator for generating a reference wave with a constant cycle, and an intermittent constant current generator for supplying current to the variable constant current circuit with the constant cycle of the reference wave. Thus, resistance and capacitance fluctuations in the differential amplifier are canceled by resistance and capacitance fluctuations in the intermittent constant current circuit, and the LPF cut-off frequency stability is improved.

A filter circuit according to the present invention, as claimed in claim 2, is such that the reference wave is a pulse wave. Thus, the transistors in the intermittent constant current generator are on-off operated with an accurate cycle.

A filter circuit according to the present invention, as claimed in one of claims 1 and 2, is such that the intermittent constant current generator charges and discharges a second capacitor provided in the intermittent constant current generator and generates a constant current proportional to the capacitance of the second capacitor with the constant cycle. It is thus possible to always ensure periodic generation of a stable constant current.

A filter circuit according to the present invention, as claimed in one of claims 1 to 3, is such that the frequency of the pulse wave is sufficiently high compared to the pass band of the filter circuit. It is thus possible to permit current supply with a cycle, with which the operation of the differential amplifier is stable.

A filter circuit according to the present invention, as claimed in one of claims 1 to 4, is such that the constant current is adjusted by varying the pulse wave frequency. It is thus possible to the mutual conductance of the differential amplifier as desired.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A filter circuit comprising:
   a constant current circuit;
   a differential amplifier with a mutual conductance thereof varying according to a constant current from the constant current circuit;
   a buffer circuit for amplifying an output current of the differential amplifier;
   a first capacitor connected to the output terminal of the differential amplifier and the input terminal of the buffer circuit, wherein the first capacitor is inserted between ground and the output terminal of the differential amplifier and the input terminal of the buffer circuit;
   a reference wave generator for generating a reference wave with a constant period; and
   an intermittent constant current generator for supplying current to the constant current circuit with the constant period of the reference wave, wherein the intermittent constant current generator charges and discharges a second capacitor provided in the intermittent constant current generator and generates a constant current proportional to the capacitance of the second capacitor with the constant cycle.

2. The filter circuit according to claim 1, wherein the reference wave is a pulse wave.

3. A filter circuit comprising:
   a constant current circuit;
   a differential amplifier with a mutual conductance thereof varying according to a constant current from the constant current circuit;
   a buffer circuit for amplifying the output current of the differential amplifier;
   a first capacitor connected to the output terminal of the differential amplifier and the input terminal of the buffer circuit, wherein the first capacitor is inserted between ground and the output terminal of the differential amplifier and the input terminal of the buffer circuit;
   a reference wave generator for generating a reference wave with a constant period; and
   an intermittent constant current generator for supplying current to the constant current circuit with the constant period of the reference wave, wherein the frequency of the reference wave is sufficiently high compared to the pass band of the filter circuit.

4. A filter circuit comprising:
   a constant current circuit;
   a differential amplifier with a mutual conductance thereof varying according to a constant current from the constant current circuit;
   a buffer circuit for amplifying an output current of the differential amplifier;
   a first capacitor connected to the output terminal of the differential amplifier and the input terminal of the buffer circuit, wherein the first capacitor is inserted between ground and the output terminal of the differential amplifier and the input terminal of the buffer circuit;
   a reference wave generator for generating a reference wave with a constant period; and
   an intermittent constant current generator for supplying current to the constant current circuit with the constant period of the reference wave, wherein the constant current is set according to the frequency of the reference wave.

5. A filter circuit including a capacitance provided between an output of a differential amplifier with a mutual conductance thereof which is varied on the basis of a current value supplied thereto and ground for amplifying the output current of the differential amplifier, wherein the output of the differential amplifier is connected to an input of a buffer circuit, wherein the current value is determined by an intermittent current with a constant period, wherein the intermittent current charges and discharges a capacitor provided in an intermittent constant current generator for generating the intermittent current and generates a constant current proportional to a capacitance of the capacitor with the constant period.

6. The filter circuit according to claim 5, wherein the intermittent current is a pulse wave.

7. A filter circuit including a capacitance provided between an output of a differential amplifier with a mutual conductance thereof which is varied on the basis of a current value supplied thereto and ground for amplifying an output current of the differential amplifier, wherein the output of the differential amplifier is connected to an input of a buffer circuit, wherein the filter circuit includes a reference wave generator which generates a reference wave with a constant period, wherein the current value is determined by an intermittent current with the constant period of the reference wave, wherein the reference wave is a pulse wave, wherein the frequency of the pulse wave is sufficiently high compared to the pass band of the filter circuit.

8. A filter circuit including a capacitance provided between an output of a differential amplifier with a mutual conductance thereof which is varied on the basis of a current value supplied thereto and ground for amplifying the output current of the differential amplifier, wherein the output of the differential amplifier is connected to an input of a buffer circuit, wherein the filter circuit includes a reference wave generator which generates a reference wave with a constant period, wherein the current value is determined by an intermittent current with the constant period of the reference wave, wherein the reference wave is a pulse wave, wherein the current value is set according to the pulse wave frequency.

9. The filter circuit according to claim 3, wherein the reference wave is a pulse wave.

10. The filter circuit according to claim 4, wherein the reference wave is a pulse wave.

* * * * *